(12) United States Patent
Jeong et al.

(10) Patent No.: US 7,701,749 B2
(45) Date of Patent: Apr. 20, 2010

(54) MULTIPLE LEVEL CELL PHASE-CHANGE MEMORY DEVICES HAVING CONTROLLED RESISTANCE DRIFT PARAMETER, MEMORY SYSTEMS EMPLOYING SUCH DEVICES AND METHODS OF READING MEMORY DEVICES

(75) Inventors: Chang-Wook Jeong, Seoul (KR); Dae-Hwan Kang, Seoul (KR); Hyeong-Jun Kim, Seoul (KR); Seung-Pil Ko, Suwon-si (KR); Dong-Won Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 12/079,886

(22) Filed: Mar. 28, 2008

(65) Prior Publication Data
US 2008/0316804 A1    Dec. 25, 2008

(30) Foreign Application Priority Data
Jun. 20, 2007    (KR) ...................... 10-2007-0060562

(51) Int. Cl.
*G11C 11/00* (2006.01)

(52) U.S. Cl. ........................... 365/148; 365/100; 365/46

(58) Field of Classification Search .................. 365/148, 365/100, 46
See application file for complete search history.

(56) References Cited
U.S. PATENT DOCUMENTS

| | | | |
|---|---|---|---|
| 5,912,839 A | 6/1999 | Ovshinsky et al. | |
| 6,023,069 A * | 2/2000 | Steinthal et al. | 250/493.1 |
| 6,503,829 B2 | 1/2003 | Kim et al. | |
| 6,625,054 B2 | 9/2003 | Lowrey et al. | |
| 6,813,177 B2 | 11/2004 | Lowrey et al. | |
| 6,928,022 B2 | 8/2005 | Cho et al. | |
| 6,967,865 B2 | 11/2005 | Lee | |
| 6,982,913 B2 | 1/2006 | Oh et al. | |
| 7,012,834 B2 | 3/2006 | Cho et al. | |
| 7,023,008 B1 | 4/2006 | Happ | |
| 7,027,342 B2 | 4/2006 | Inoue | |

(Continued)

FOREIGN PATENT DOCUMENTS

JP    2006-004480    1/2006

(Continued)

OTHER PUBLICATIONS

A. Pirovano, et al., "Low-Field Amorphous State Resistance and Threshold . . . ," IEEE Transactions on Electron Devices, vol. 51, No. 5., pp. 714-719, May 2004.

(Continued)

*Primary Examiner*—Thong Q Le
(74) *Attorney, Agent, or Firm*—Mills & Onello, LLP

(57) ABSTRACT

In a method of controlling resistance drift in a memory cell of a resistance-changeable material memory device, the resistance changeable material in the memory cell is treated so that a drift parameter for the memory cell is less than about 0.18, wherein a change in resistance of a memory cell over the time period is determined according to the relationship:

$$R_{drift} = R_{initial} \times t^{\alpha};$$

where $R_{drift}$ represents a final resistance of the memory cell following the time period, $R_{initial}$ represents the initial resistance of the memory cell following the programming operation, t represents the time period; and α represents the drift parameter.

26 Claims, 11 Drawing Sheets

U.S. PATENT DOCUMENTS

| | | |
|---|---|---|
| 7,085,154 B2 | 8/2006 | Cho et al. |
| 7,371,429 B2 | 5/2008 | Lee et al. |
| 2003/0155606 A1 | 8/2003 | Campbell et al. |
| 2004/0114419 A1 | 6/2004 | Lowrey et al. |
| 2004/0246804 A1 | 12/2004 | Cho et al. |
| 2004/0246808 A1 | 12/2004 | Cho et al. |
| 2005/0052904 A1 | 3/2005 | Cho et al. |
| 2005/0068804 A1 | 3/2005 | Choi et al. |
| 2005/0117388 A1 | 6/2005 | Cho et al. |
| 2005/0174841 A1 | 8/2005 | Ho |
| 2005/0276138 A1 | 12/2005 | Inoue |
| 2006/0011902 A1 | 1/2006 | Song et al. |
| 2006/0013058 A1 | 1/2006 | Kang et al. |
| 2006/0046509 A1 | 3/2006 | Gwan-Hyeob |
| 2006/0050548 A1 | 3/2006 | Oh et al. |
| 2006/0071204 A1 | 4/2006 | Happ |
| 2006/0076548 A1 | 4/2006 | Park et al. |
| 2006/0092694 A1 | 5/2006 | Choi et al. |
| 2006/0113520 A1 | 6/2006 | Yamamoto et al. |
| 2006/0118913 A1 | 6/2006 | Yi et al. |
| 2006/0120148 A1 | 6/2006 | Kim et al. |
| 2006/0138393 A1 | 6/2006 | Seo et al. |
| 2006/0152186 A1 | 7/2006 | Suh et al. |
| 2006/0180803 A1 | 8/2006 | Suh et al. |
| 2006/0180811 A1 | 8/2006 | Lee et al. |
| 2006/0181932 A1 | 8/2006 | Cho et al. |
| 2006/0186483 A1 | 8/2006 | Cho et al. |
| 2006/0192193 A1 | 8/2006 | Lee et al. |
| 2006/0226411 A1 | 10/2006 | Lee |
| 2006/0250885 A1 | 11/2006 | Cho et al. |
| 2006/0266993 A1 | 11/2006 | Suh et al. |
| 2007/0008774 A1 | 1/2007 | Khang |
| 2007/0012906 A1 | 1/2007 | Kim et al. |
| 2007/0018157 A1 | 1/2007 | Hideki |
| 2007/0020799 A1 | 1/2007 | Choi et al. |
| 2007/0029606 A1 | 2/2007 | Noh et al. |
| 2007/0030025 A1 | 2/2007 | Lim et al. |
| 2007/0051935 A1 | 3/2007 | Lee et al. |
| 2007/0054493 A1 | 3/2007 | Nam |
| 2007/0080384 A1 | 4/2007 | Noh et al. |
| 2007/0108433 A1 | 5/2007 | Lee et al. |
| 2007/0108488 A1 | 5/2007 | Suh et al. |
| 2007/0133270 A1 | 6/2007 | Jeong et al. |
| 2007/0148933 A1 | 6/2007 | Lee et al. |
| 2007/0152754 A1 | 7/2007 | Khang et al. |
| 2007/0153570 A1 | 7/2007 | Suh et al. |
| 2007/0160760 A1 | 7/2007 | Shin et al. |
| 2007/0170881 A1 | 7/2007 | Noh et al. |
| 2007/0184613 A1 | 8/2007 | Kim et al. |
| 2007/0185712 A1 | 8/2007 | Jeong et al. |
| 2007/0189065 A1 | 8/2007 | Suh et al. |
| 2007/0194294 A1 | 8/2007 | Song et al. |
| 2007/0195581 A1 * | 8/2007 | Morimoto ............... 365/148 |
| 2007/0200108 A1 | 8/2007 | Noh et al. |
| 2008/0258127 A1 | 10/2008 | Lee et al. |

FOREIGN PATENT DOCUMENTS

| | | |
|---|---|---|
| JP | 2006-510153 | 3/2006 |
| KR | 10-2004-0075033 | 8/2004 |
| KR | 1020060061232 A | 7/2006 |
| KR | 10-0642084 | 10/2006 |
| KR | 10-06474533 | 1/2007 |
| KR | 1020060091150 | 2/2007 |
| WO | WO 2004/055827 A1 | 7/2004 |
| WO | WO 2006034953 A1 | 4/2006 |

OTHER PUBLICATIONS

D. Ielmini, et al., "Recovery and Drift Dynamics of Resistance . . . ," IEEE Transactions on Electron Devices, vol. 54, No. 2, pp. 308-315, Feb. 2007.

A. Itri, et al., "Analysis of Phase-Transformation Dynamics and Estimation . . . ," 42nd Annual International Reliability Physics Symposium, pp. 209-215, Phoenix, Arizona, 2004.

R. Street, et al., "States in the Gap in Glassy Semiconductors," Physical Review Letters, vol. 35, No. 19, pp. 1293-1296, Nov. 10, 1975.

M. Kastner, et al., "Valence-Alternation Model for Localized Gap States in . . . ," Physical Review Letters, vol. 37, No. 22, pp. 1504-1507, Nov. 29, 1976.

* cited by examiner $T_m$: Melting Temp.
$T_c$: Crystallization Temp.

MULTIPLE LEVEL CELL PHASE-CHANGE MEMORY DEVICES HAVING CONTROLLED RESISTANCE DRIFT PARAMETER, MEMORY SYSTEMS EMPLOYING SUCH DEVICES AND METHODS OF READING MEMORY DEVICES

RELATED APPLICATIONS

This application claims priority under 35 U.S.C. 119 to Korean Patent Application No. 2007-60562 filed on Jun. 20, 2007, the content of which is incorporated herein by reference in its entirety.

This application is related to U.S. Ser. No. 12/079,869, filed of even date herewith, entitled "Multiple-Level Cell Phase-Change Memory Devices Having Pre-Reading Operation Resistance Drift Recovery, Memory Systems Employing Such Devices, and Methods of Reading Memory Devices," by Chang-Wook Jeong, et al., and commonly owned with the present application, the content of which is incorporated herein by reference.

This application is related to U.S. Ser. No. 12/079,892, filed of even date herewith, entitled "Multiple-Level Cell Phase-Change Memory Devices Having Post-Programming Operation Resistance Drift Saturation, Memory Systems Employing Such Devices, and Methods of Reading Memory Devices," by Chang-Wook Jeong, et al., and commonly owned with the present application, the content of which is incorporated herein by reference.

BACKGROUND OF THE INVENTION

A phase-change memory or phase-change random access memory (PRAM) as referred to herein is also referred to as an ovonic unified memory (OUM) in the art. The OUM cell is based on a volume of chalcogenide alloy, which, after being heated and cooled, adopts one of two stable, but programmable, phases: crystalline or amorphous. The resistance of the first phase, i.e., the crystalline phase, is relatively low, and the resistance of the second phase, i.e., the amorphous phase, is relatively high. A programming of the state of the cell to a logical one (1) or zero (0) depends on the phase of the programmable volume, and is determined by measuring its resistance. The crystalline, or conductive, state is commonly referred to as the "set", or "0", state; and the amorphous or resistive non-conductive state is commonly referred to as the "reset", or "1", state.

To make the programmable volume amorphous, it is heated above its melting point by a resistive heater. To make the programmable volume crystalline, it is heated to just below its melting point for a short period of time, e.g., 50 ns, so that the atoms line up in their crystalline locations. The volume cools rapidly into the stable amorphous or stable crystalline states when the heater is turned off. In this manner, data is written to the cell by programming the cell to either the crystalline or amorphous states. Reading of the programmed cell is performed by a sense amplifier measuring the resistance of the programmed cell.

The key to the phase-change memory is the chalcogenide material. The device historically includes an alloy of germanium (Ge), antimony (Sb) and tellurium (Te), which is referred to commonly as a GST alloy. The material is particularly useful for incorporation in a memory device because of its ability to switch rapidly, when heated and cooled, between the stable amorphous and crystalline phases.

A memory cell that incorporates a chalcogenide material typically includes a top electrode, a patterned layer, or volume, of the chalcogenide material, and a lower electrode that serves as a resistive heating element. FIG. 1 is a schematic diagram illustrating a memory cell 10 which uses the programmable chalcogenide material. The cell 10 includes a conductive top electrode 12 formed over the programmable phase change chalcogenide material 14. A conductive bottom electrode contact (BEC) 16 is formed under the programmable material 14. The bottom electrode contact (BEC) is formed of a higher resistivity material such as TiAlN, TiN, and the like, so that it operates as a resistive heater by generating heat when current flows through the BEC. An access transistor 20 (see FIGS. 2A and 2B) is connected to the bottom electrode contact 16 for controlling the flow of current through the cell 10. The gate of the access transistor 20 is commonly connected to a word line WL of the memory device incorporating the cell 10.

FIGS. 2A and 2B are schematic diagrams which illustrate the cell 10 in each of the two programmed states. In FIG. 2A, the cell 10 is shown in the conductive set, or "0", state. In this state, some portion of the programmable material 14 in contact with the BEC is in the crystalline state. In FIG. 2B, the cell 10 is shown in the resistive reset, or "1", state. In this state, some portion of the programmable material 14 in contact with the BEC is in the amorphous state.

FIG. 3 is a schematic diagram schematically illustrating the electrical configuration of the cell 10. A word line WL controls the flow of current through the cell 10 at the gate of access transistor 20. The resulting current flowing through the cell 10, $I_{CELL}$, and activation of the bit line BL connected to the top electrode 12 of the cell 10 serves to program the state of the cell 10 during a writing, or programming operation, and serves as a parameter for reading the state of the cell 10 during a reading, or sensing operation.

FIG. 4 is a timing diagram illustrating programming of a memory cell that includes a volume of programmable chalcogenide material, for example of the type illustrated and described above in connection with FIGS. 1-3. The timing diagram of FIG. 4 is a graph of temperature with respect to time illustrating the programming pulses of heat used in conventional apparatus for programming the material to the set (crystalline) state and the reset (amorphous) state. The curve labeled 22 illustrates the time-temperature relationship for the reset pulse, i.e., the temperature pulse used to program the material to the reset (amorphous) state; and the curve labeled 24 illustrates the time-temperature relationship for the set pulse, i.e., the temperature pulse used to program the material to the set (crystalline) state.

Referring to the curve labeled 22 in FIG. 4, to change the programmable volume of chalcogenide material to the amorphous phase (reset state), the chalcogenide alloy is heated to a temperature above its melting point (Tm), by a resistive heater. The heating pulse is applied for a relatively short period of time, e.g., a few nanoseconds. The alloy cools rapidly when the heater is turned off over a time period T1, referred to as a quenching period, to a temperature that is below the crystallization temperature Tc of the volume. Following the quenching period, the volume of chalcogenide material is placed in a stable, amorphous state.

Referring to the curve labeled 24 in FIG. 4, to change the programmable volume to the crystalline phase (set state), the alloy is heated to a temperature below its melting point Tm, for example, to a temperate between the crystallization temperature Tc and the melting temperature Tm of the material, by the resistive heater. The temperature is maintained for a time period T2 that is relatively longer than the time period T1 to allow portions of the alloy to crystallize. The alloy cools rapidly when the heater is turned off, to a temperature that is below the crystallization temperature Tc of the volume. After the crystallization is achieved, the set heating pulse is removed, and the material cools to a stable, crystalline state.

Research has been conducted toward the fabrication of PRAM devices that have multiple programmable states. For example, while the above examples demonstrate PRAM cells having two states, namely amorphous (reset) and crystalline (set), others have experimented with PRAM cells having multiple so-called "hybrid", or "intermediate", states between the amorphous and crystalline "end" states. In the intermediate states, the programmable volume is partially amorphous and partially crystalline, and by controlling the relative percentages of amorphous and crystalline volumes of programmable material, the resulting resistance of the cell can be controlled. In this manner, each resulting PRAM cell can be said to have multiple, programmable states, or multiple levels, each corresponding to a unique resistance value. Research in the field of multiple-level PRAMs has been conducted by Itri, et al., "Analysis of phase-transformation dynamics and estimation of amorphous-chalcogenide fraction in phase-change memories," IEEE $42^{nd}$ Annual International Reliability Physics Symposium, Phoenix, 2004, pp 209-215, the content of which is incorporated herein by reference.

Others have determined that the resistance value of a programmed chalcogenide volume can vary with time. See, for example, Pirovano, et al., "Low-Field Amorphous State Resistance and Threshold Voltage Drift in Chalcogenide Materials," IEEE Transactions on Electron Devices, Vol. 51, No. 5, May 2004, pp 714-719, the content of which is incorporated herein by reference. The resulting "resistance drift" is especially significant in the amorphous state of a two-level PRAM cell, and in the partially amorphous intermediate states and the fully amorphous state of the multiple-level PRAM cell. In an attempt to control resistance drift, others have studied the behavior of resistance drift dynamics. See, for example, Ielmini, et al., "Recovery and Drift Dynamics of Resistance and Threshold Voltages in Phase-Change Memories," IEEE Transactions on Electron Devices, Vol. 54, No. 2, February 2007, pp 308-315, the content of which is incorporated herein by reference. However, resistance drift remains a difficult problem to address, especially in multiple-level PRAM devices.

SUMMARY OF THE INVENTION

Embodiments of the present invention are directed to multiple level cell phase-change memory devices, memory systems employing such devices and methods of reading memory devices, wherein a resistance drift parameter for a memory cell is selected to control resistance drift of the cell to within predetermined, acceptable, known, limits. In this manner, the reading operation of the memory device can be performed reliably, with the resistance drift in the material accounted for.

In one aspect, a method of controlling resistance drift in a memory cell of a resistance changeable material memory device comprises treating the resistance changeable material in the memory cell so that a drift parameter for the memory cell is less than about 0.18, wherein a change in resistance of a memory cell over the time period is determined according to the relationship:

$$R_{drift}=R_{initial} \times t^{\alpha};$$

where $R_{drift}$ represents a final resistance of the memory cell following the time period, $R_{initial}$ represents the initial resistance of the memory cell following the programming operation, t represents the time period; and α represents the drift parameter.

The memory cell can be programmed by the programming operation to occupy one of a plurality of states, each state of the plurality of states corresponding to a range of resistances that are independent of neighboring resistance ranges of neighboring states, wherein the initial resistance of a memory cell occupies an initial state corresponding to an initial range of resistances following the programming operation and wherein the initial range of resistances of each state is selected so that a resistance of the memory cell remains in the initial range of resistances following the time period.

The memory cell can be programmed by the programming operation to occupy more than two states.

A low state of the plurality of states can correspond to a state having a lowest range of resistances, a high state of the plurality of states can correspond to a state having a highest range of resistances, and at least one intermediate state of the plurality of states can correspond to at least one state having a range of resistances greater than the lowest range of resistances of the low state and less than the highest range of resistances of the high state, wherein the memory cell is programmed to occupy the at least one intermediate state of the plurality of states.

The drift parameter for the memory cell, in one embodiment, is less than about 0.058.

The resistance changeable material can comprise a chalcogenide-based material.

Treating a resistance changeable material in the memory cell can comprise controlling the drift parameter of the memory cell by doping the resistance changeable material in the memory cell with a doping material that includes nitrogen or carbon.

Treating a resistance changeable material in the memory cell can comprise controlling the drift parameter of the memory cell by processing the resistance changeable material in the memory cell to include hydrogen atoms in the material.

Processing the resistance changeable material can comprise providing a source material including hydrogen atoms during formation of the resistance changeable material.

Processing the resistance changeable material can comprise annealing in a hydrogen ambient after formation of the resistance changeable material.

Processing the resistance changeable material can comprise implanting hydrogen ions in the resistance changeable material.

Processing the resistance changeable material can comprise: forming a layer containing hydrogen on the resistance changeable material; and heat treating the layer so that the hydrogen diffuses into the resistance changeable material.

In another aspect, a memory device comprises a plurality of memory cells, each memory cell comprising a resistance changeable material that has an initial resistance that is determined in response to an applied programming current in a programming operation, the resistance of the memory cell varying from the initial resistance over a time period following the programming operation, according to the relationship:

$$R_{drift}=R_{initial} \times t^{\alpha},$$

where $R_{drift}$ represents a final resistance of the memory cell following the time period, $R_{initial}$ represents the initial resistance of the memory cell following the programming operation, t represents the time period; and α represents a drift parameter of the memory cell, and wherein the drift parameter is less than about 0.18.

Each memory cell can be programmed by the programming operation to occupy one of a plurality of states, each state of the plurality of states corresponding to a range of resistances that are independent of neighboring resistance ranges of neighboring states, wherein the initial resistance of a memory cell occupies an initial state corresponding to an initial range of resistances following the programming operation and wherein the initial range of resistances of each state is selected so that a resistance of the memory cell remains in the initial range of resistances following the time period.

The memory cell can be programmed by the programming operation to occupy more than two states.

A low state of the plurality of states can correspond to a state having a lowest range of resistances, a high state of the plurality of states can correspond to a state having a highest range of resistances, and at least one intermediate state of the plurality of states can correspond to at least one state having a range of resistances greater than the lowest range of resistances of the low state and less than the highest range of resistances of the high state.

The memory cell can be programmed to occupy the at least one intermediate state of the plurality of states.

The drift parameter for the memory cell, in one embodiment, is less than about 0.058.

The resistance changeable material can be a chalcogenide-based material.

The drift parameter of the memory cell can be determined by doping the resistance changeable material in the memory cell with a doping material that includes nitrogen or carbon.

The drift parameter of the memory cell can be determined by processing the resistance changeable material in the memory cell to include hydrogen atoms in the material.

The initial resistance can correspond to a ratio of an amount of the cell material that is in a crystalline state relative to an amount of the cell material that is in an amorphous state, as a result of the programming operation.

Each memory cell can further comprise a heating electrode in thermal communication with the corresponding cell material of the memory cell, the heating electrode receiving the programming current to heat the corresponding memory cell so that the cell material has the initial resistance.

The chalcogenide material can comprise, for example, a material selected from the group of materials consisting of Ge, Sb, Sn, As, Si, Pb, Te, Se, S, a combination thereof, and an alloy thereof.

The chalcogenide material can further include at least one impurity selected from the group consisting of Bi, Sr, Si, and O.

In another aspect, an electronic device includes a memory system, the memory system comprising: a memory controller that is arranged to connect to a data bus at which data signals are transferred; and a memory device connected to the memory controller that stores and retrieves the data signals, the memory device comprising a plurality of memory cells, each memory cell comprising a resistance changeable material that has an initial resistance that is determined in response to an applied programming current in a programming operation, the resistance of the memory cell varying from the initial resistance over a time period following the programming operation, according to the relationship:

$$R_{drift} = R_{initial} \times t^\alpha,$$

where $R_{drift}$ represents a final resistance of the memory cell following the time period, $R_{initial}$ represents the initial resistance of the memory cell following the programming operation, t represents the time period; and α represents a drift parameter of the memory cell, and wherein the drift parameter is less than about 0.18.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
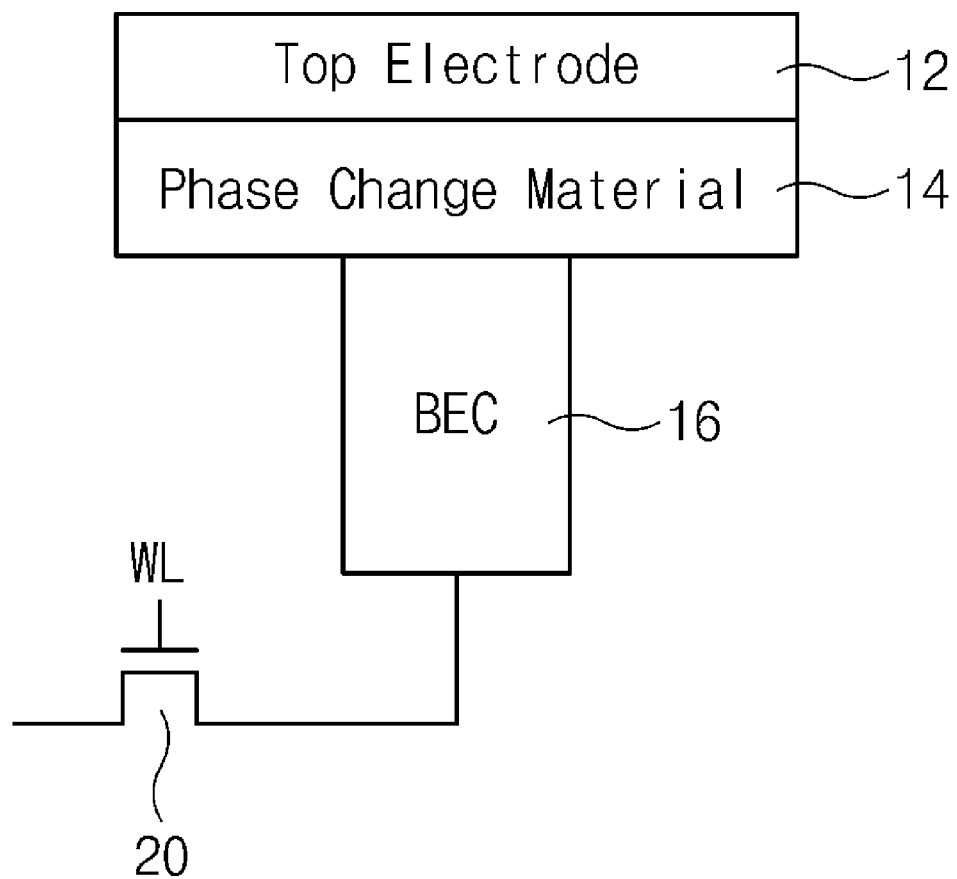
FIG. 1 is a schematic diagram that illustrates a conventional memory cell that employs a programmable chalcogenide material.
Figure 2A:
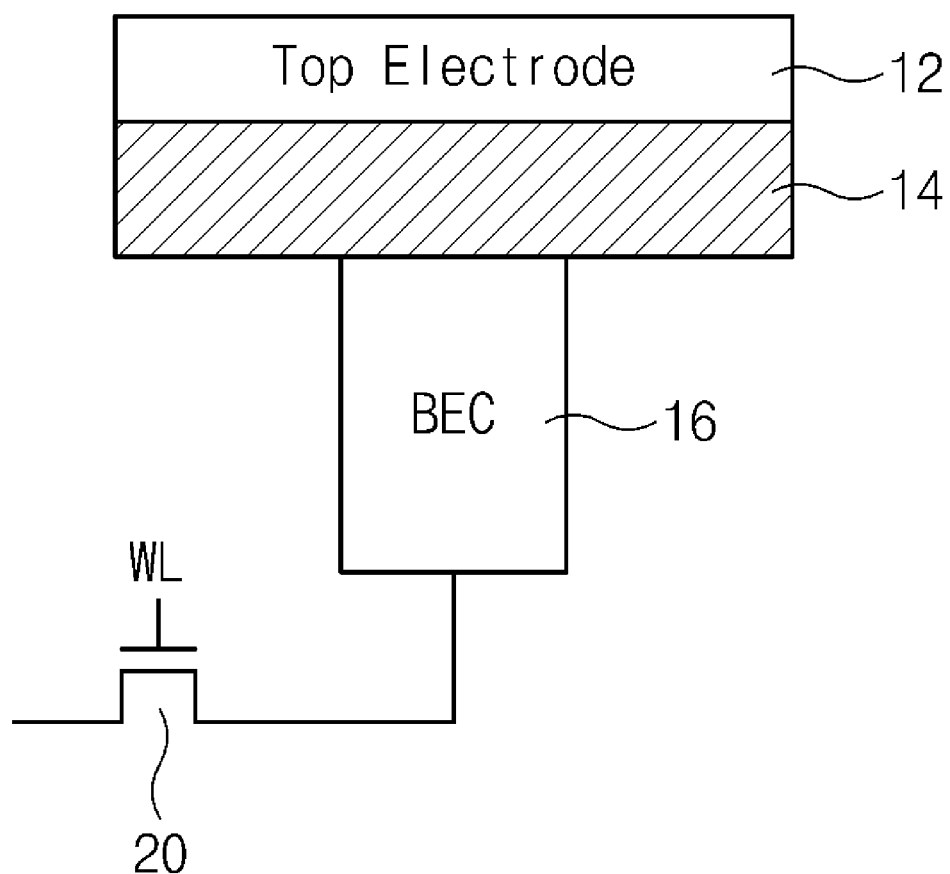
FIGS. 2A and 2B are schematic diagrams that illustrate the conventional memory cell in each of two programmed states.
Figure 2B:
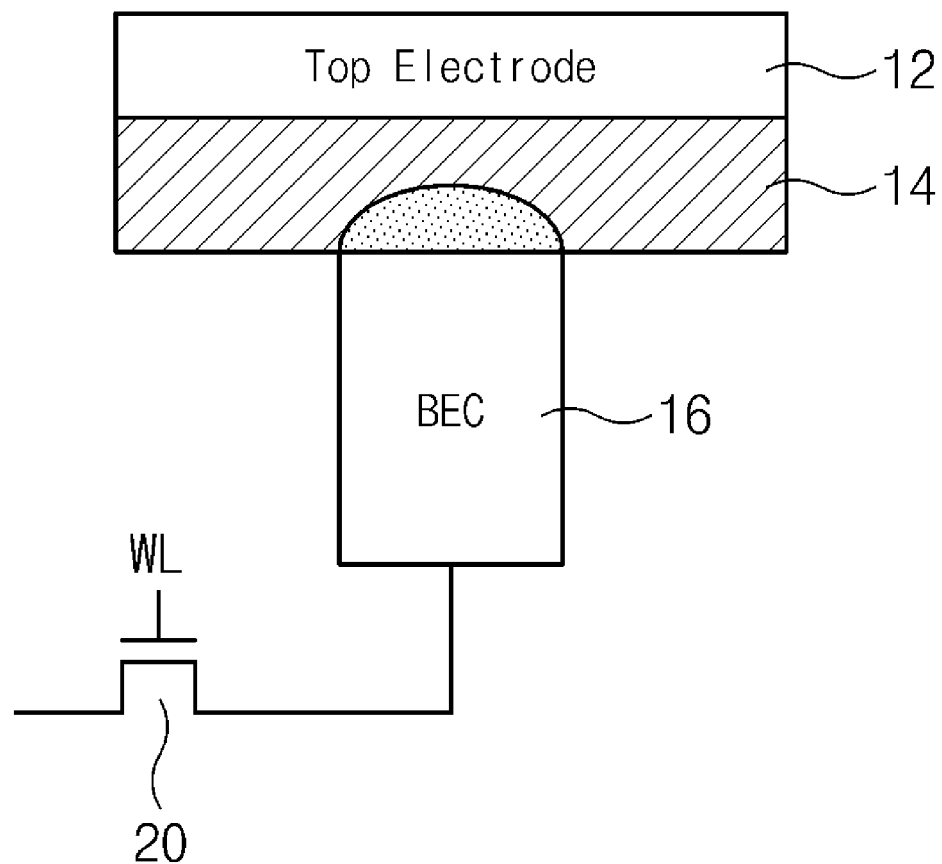
Figure 3:
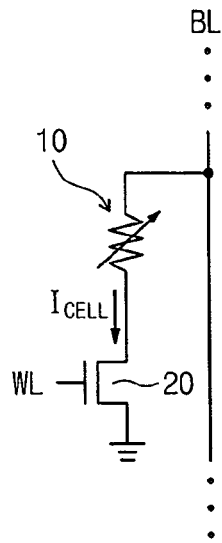
FIG. 3 is an equivalent circuit diagram of the conventional memory cell of FIGS. 1, 2A and 2B.
Figure 4:
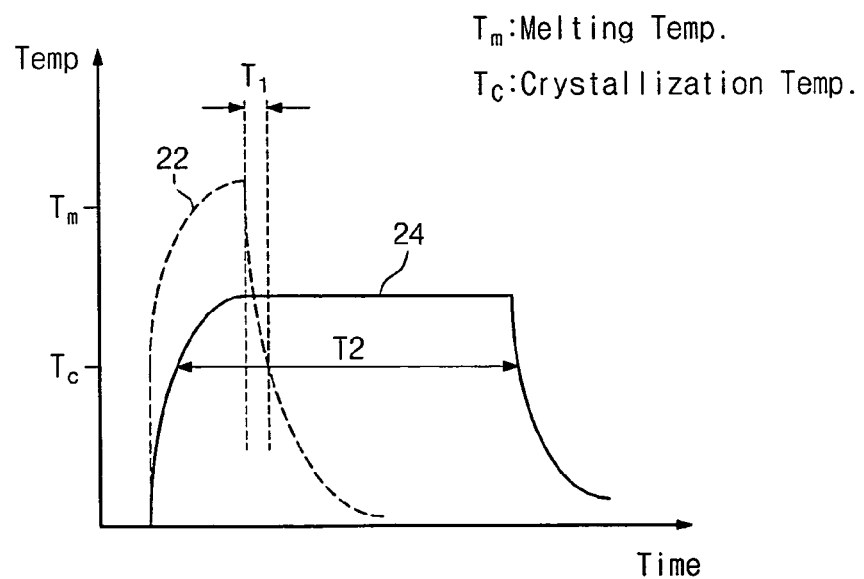
FIG. 4 is a timing diagram illustrating programming of a memory cell that includes a programmable chalcogenide material.
Figure 5A:
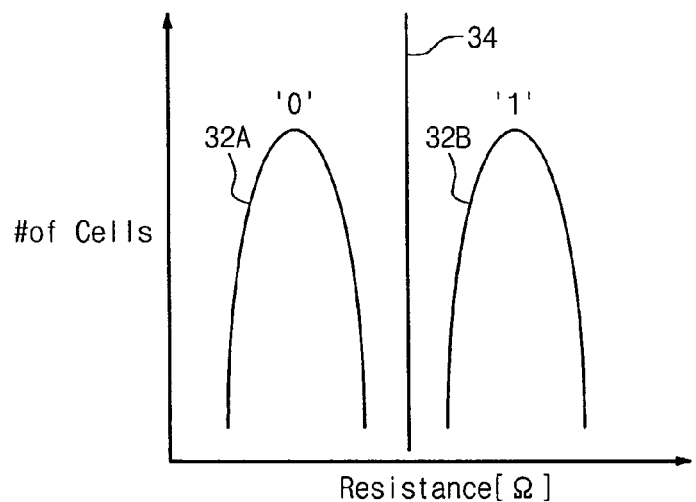
FIG. 5A is a conceptual chart of the partitioning of resistance values into two distinct states for a two-level cell.
Figure 5B:
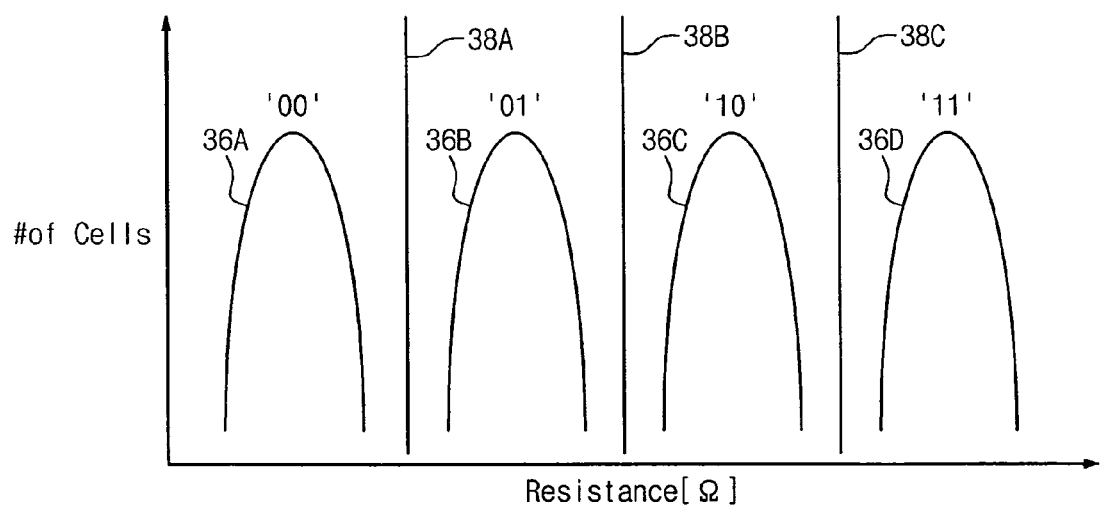
FIG. 5B is a conceptual chart of the partitioning of resistance values into multiple distinct states for a multiple-level cell, in this case, a four-level cell.
Figure 5C:
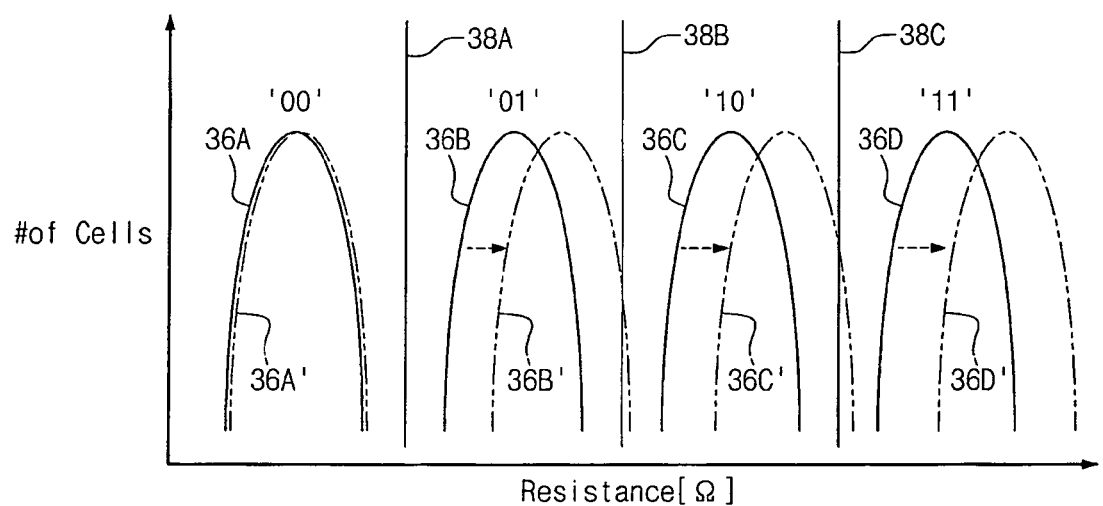
FIG. 5C is a conceptual chart of the partitioning of resistance values into multiple distinct states for the multiple level cell of FIG. 5B, illustrating the effects of resistance drift.

FIG. 5A is a conceptual chart of the partitioning of resistance values into two distinct states for a two-level phase-change memory cell; FIG. 5B is a conceptual chart of the partitioning of resistance values into multiple distinct states for a multiple-level phase-change memory cell, in this case, a four-level cell; and FIG. 5C is a conceptual chart of the partitioning of resistance values into multiple distinct states for the multiple level phase-change memory cell of FIG. 5B, illustrating the effects of resistance drift.

Referring to FIG. 5A, the states of a standard, two-level, phase-change memory cell are depicted. Such two-level cells are referred to in the art as "single-level" cells. Following programming of the cell, a distribution of resulting resistance values can fall into one of two states "0" and "1". Any resistance values of the programmed cell that fall into the range of a first distribution curve 32A are determined as a "0" state, and any resistance values of the programmed cell that fall into the range of a second distribution curve 32B are determined as a "1" state. In this case, the resistance values corresponding to the first and second distribution curves 32A, 32B are readily separable by a boundary resistance value 34; that is, if the determined resistance value is less than the boundary value 34 it is considered to correspond to the "0" state, and if the determined resistance value is greater than the boundary value 34 it is considered to correspond to the "1" state.

Referring to FIG. 5B, the states of a four-level phase-change memory cell are depicted. Following programming of the cell, resulting resistance values can fall into one of four states "00", "01", "10" and "11". The "00" and "11" states are referred to herein as "end states" since they correspond to resistance values at the lower and upper ends of the range of resistance values, respectively. The "00" end state may correspond to the crystalline state of the cell and the "11" end state may correspond to the amorphous state of the cell. The "01" and "10" states may correspond to intermediate, partially-amorphous states of the cell, with the "01" state corresponding to the cell being programmed to have relatively less amorphous material and the "10" state corresponding to the cell have relatively more amorphous material. Multiple-level cells are beneficial to system integration, since more than two states can be programmed into a single cell. While the "00" and "11" states are referred to herein as corresponding to "crystalline" and "amorphous" states, respectively, such end states of the device do not necessarily correspond to "fully crystalline" and "fully amorphous" states, wherein the volume of programmable material is fully crystalline or fully amorphous. Rather, such end states can equally correspond to states that are partially crystalline and partially amorphous, as in the intermediate states, with, the "00" end state being primarily crystalline, that is containing more crystalline material than the other states, and the "11" end state being primarily amorphous, that is containing more amorphous material than the other states.

Any resistance values of the programmed cell that fall into the range of a first distribution curve 36A are determined as a "00" state, any resistance values of the programmed cell that fall into the range of a second distribution curve 36B are determined as a "01" state, any resistance values of the programmed cell that fall into the range of a third distribution curve 36C are determined as a "10" state, and any resistance values of the programmed cell that fall into the range of a fourth distribution curve 36D are determined as a "11" state. In this case, the resistance values corresponding to the first and fourth distribution curves 36A, 36D belonging to the end states "00" and "11" are readily separated from neighboring distribution curves 36B, 36C by corresponding boundary resistance values 38A, 38C. For example, if the determined resistance value is less than the boundary value 38A, it is considered to correspond to the "00" state, and if the determined resistance value is greater than the boundary value 38C it is considered to correspond to the "11" state. However, the resistance values of the second and third distribution curves 36B, 36C belonging to the intermediate states "01" and "10" are much more susceptible to the resistance drift phenomenon. This increased susceptibility is illustrated in FIG. 5C.

Referring to FIG. 5C, the effects of resistance drift on the distribution curves 36A, 36B, 36C, 36D corresponding to the four states "00", "01", "10", "11" can be seen. After a time period, the resistance values corresponding to pre-drift distribution curve 36A drift, due to the transitioning of unstable defects in the chemical lattice of the programmable volume to more stable defects, causing the curve to shift to a post-drift distribution curve 36A'. Similarly, the resistance values corresponding to pre-drift distribution curve 36B drift, causing the curve to shift to a post-drift distribution curve 36B'; the resistance values corresponding to pre-drift distribution curve 36C drift, causing the curve to shift to a post-drift distribution curve 36C'; and the resistance values corresponding to pre-drift distribution curve 36D drift, causing the curve to shift to a post-drift distribution curve 36D'.

In FIG. 5C it can be seen that post-drift distribution curve 36A' has drifted a relatively small amount, relative to its pre-drift distribution curve 36A. This is because the resistance values associated with the first distribution curve 36A are a result of the programmable volume containing relatively more, or being completely formed of, crystallized material. Since the matrix of crystallized material contains relatively fewer unstable defects than a corresponding matrix of amorphous material, the crystallized material will experience relatively less resistance drift. It can also be seen in FIG. 5C that the second, third and fourth post-drift distribution curves 36B', 36C', 36D' have drifted a relatively large amount, relative to their pre-drift distribution curves 36B, 36C, 36D. The amount of resistance drift generally increases along with increased amorphous content in the programmed volume of material.

In the case of the two-level cell (see FIG. 5A), resistance drift can be more readily managed, because the resistance values corresponding to the two states "0" and "1" can be made to be substantially separated from each other by selection of an appropriate boundary resistance value 34, so that, even after the occurrence of substantial resistance drift over long time periods, the resulting port-drift resistance value of the amorphous state "1" is still above the boundary resistance value 34, and the resulting post-drift resistance value of the crystalline state "0" is still below the boundary resistance value 34. Because only two states are needed, resistance drift is not a primary concern in the standard, two-level cell.

In the case of the multiple-level cell, having states such as those depicted in FIGS. 5B and 5C, management of resistance drift is significant. For the "00" and "11" end states, resistance drift can be readily managed by setting appropriate boundary values 38A, 38C. For example, if boundary value 38A is selected to clearly define the resistance values corresponding to the first distribution curve 36A, which is known to be less susceptible to resistance drift, then management of resistance drift for the end state "00" can be readily managed. Similarly, if boundary value 38C is selected to greatly exceed the highest of the predicted resulting post-drift resistance values corresponding to the third distribution curve 36C', then all resulting resistance values higher than this boundary value 38C can be determined to correspond to the end state "11", irrespective of the amount of resistance drift experienced by resistance values pertaining to the fourth post-drift distribution curve 36D'.

However, for the "01" and "01" intermediate states, in this example, management of the resistance drift is required. For example, resistance drift of the second pre-drift distribution curve 36B results in the second post-drift distribution curve 36B' crossing the pre-defined boundary value 38B separating the second and third, intermediate states "01" and "10". Similarly, resistance drift of the third pre-drift distribution curve 36C results in the third post-drift distribution curve 36C' crossing the pre-defined boundary value 38C separating the third state, namely intermediate states "01", and the fourth state, namely end state "11". Without proper management of the resistance drift phenomenon, it can be seen that improper state determinations can occur during a subsequent read operation of the memory cell.

The mechanism behind the resistance drift phenomenon is well-described in the Pirovano, et al. paper cited above. Resistance drift may occur due to the presence of certain defect structures in the chemical lattice of the chalcogenide programmable volume upon programming. Over time, the defects, which are initially unstable (such as unstable $C_3^0$ structures, where C represents the chalcogenide atom), transition to more stable structures (such as relatively stable $C_3^+$ and $C_1^-$ structures), according to the chemical relationship:

$$2C_3^0 \rightarrow C_3^+ + C_1^- \quad (1)$$

The density of unstable defects has a direct effect on the resistance of the programmable volume; therefore, the resulting resistance of the programmable volume of material is varied. Such unstable defects are less common, i.e. they are of lower density, in the crystallized state, which is why resistance drift is less significant for a device programmed into the crystallized state than it is for a device programmed to have a percentage of amorphous material.

In embodiments of the present invention, including multiple level cell phase-change memory devices, memory systems employing such devices and methods of reading memory devices, a resistance drift parameter for a memory cell is selected to control resistance drift of the cell to within predetermined, acceptable, known, limits. In this manner, the reading operation can be performed reliably, with the resistance drift of the material accounted when conducting the reading operation.

In one embodiment, the acceptable resistance drift is determined by controlling a resistance drift parameter, referred to herein as the drift exponent, α, of the material of the programmable volume, to be less than about 0.18.

In one embodiment, the chemical lattice of the programmable volume is doped with impurities at the time of manufacture, in order to ensure acceptable, predictable, resistance drift in the resulting memory cell over time. In one example, the impurity comprises nitrogen or carbon; however, other impurities can be used.

In another embodiment, a hydrogen annealing process is performed on the chemical lattice of the programmable volume at the time of its formation, so that hydrogen is available in the volume of material. With the presence of hydrogen in the material, certain unstable defects that are naturally generated in the programmable volume at the time of programming can be stabilized, limiting the amount of resistance drift that occurs.

Others have demonstrated that resistance drift in a phase-change material generally corresponds to the relationship:

$$R_{drift} = R_{initial} \times t^\alpha; \quad (2)$$

where $R_{drift}$ represents the final resistance of the programmable volume, $R_{initial}$ represents the initial resistance of the programmable volume, t represents the amount of time that has passed; and α represents the drift exponent.

By controlling the value of the resistance drift exponent α of the programmable volume of the material, to be an acceptable, predefined, value, for example, less than about 0.18, it has been determined that the resulting phase-change memory cell employing such a programmable volume can operate reliably. For example, the programmable volume can retain programmed information in a non-volatile setting, for a time period of at least ten years of dormancy. This calculation assumes a 100 kilohm initial resistance value $R_{initial}$, with 30% resistance tolerance over ten years t of dormancy, resulting in a final resistance value $R_{drift}$ at the time of the reading operation of the memory cell. A resistance value of 100 kilohm is assumed as the initial resistance in this example, since that value is typically determined as the maximum initial resistance value that corresponds to the end state of the cell having the highest percentage of amorphous content upon programming.

In other examples, assuming a 100 kilohm initial resistance value $R_{initial}$, with a 20% resistance tolerance over ten years t of dormancy, the value of the resistance drift exponent α of the programmable volume of the material should be less than about 0.12. Assuming a 100 kilohm initial resistance value $R_{initial}$, with a 10% resistance tolerance over ten years t of dormancy, the value of the resistance drift exponent α of the programmable volume of the material should be less than about 0.058.

With reference to Table 1, a change rate ($^\Delta R/R_{ini}$) of resistance in the programmed state should be within an allowable tolerance in which stable operation of the phase change memory is ensured. In a case where $R_{ini}$ is 10 kΩ, 20 kΩ, 50 kΩ, 100 kΩ, a maximum allowed value of the drift parameter (α), i.e., a critical drift parameter ($α_c$), is shown in table 1. In Table 1, examples of the allowed tolerances are given as 10%, 20%, 30%. For example, in a case where the initial resistance $R_{ini}$ is 100 kΩ, the critical drift parameter ($α_c$) will be 0.18 when the allowed tolerance is 30%, and the critical drift parameter ($α_c$) will be 0.058 when the allowed tolerance is 10%.

TABLE 1

| $R_{ini}$ (kΩ) | Tolerance of Δ R/$R_{ini}$ | | |
|---|---|---|---|
| | 10% | 20% | 30% |
| 100 | 0.058 | 0.12 | 0.18 |
| 50 | 0.055 | 0.11 | 0.17 |
| 20 | 0.050 | 0.10 | 0.15 |
| 10 | 0.047 | 0.09 | 0.14 |

I. Impurity Doping

It has been determined that control over the value of the resistance drift exponent α of the programmable volume of the resistance-changeable material can be accomplished in a first embodiment of the present invention by doping the chemical lattice of the material with an appropriate impurity. In one example, it has been determined that a programmable material of GST doped with nitrogen can be used. In another example, it has been determined that a programmable material of GST doped with carbon can be used.

In various embodiments, the programmable volume of a memory cell can comprise a chalcogenide material, for example, consisting of Te, Se, S, a combination thereof, or an alloy thereof, or can comprise a material selected from a group consisting of Ge, Sb, Sn, As, Si, Pb, Te, Se, S, a combination thereof, and an alloy thereof. While an impurity including carbon or nitrogen is specifically mentioned herein, other impurities, including Bi, Sr, Si, O, etc., a combination thereof, or an alloy thereof, can be applied to control the resistance drift parameter α of the resulting resistance-changeable material.

Figure 6:
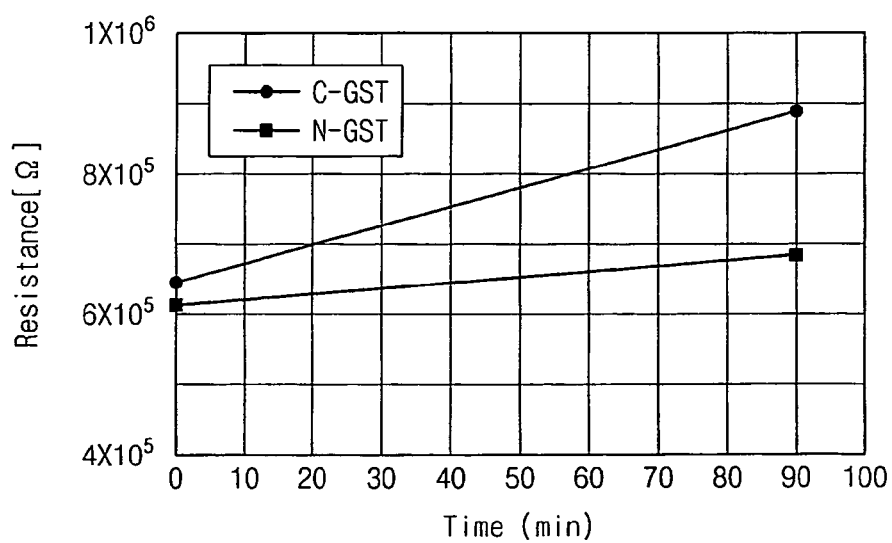
FIG. 6 is a graph that illustrates the change in resistance as a function of time for a resistance-changeable material doped with carbon, and for a resistance-changeable material doped with nitrogen, in accordance with embodiments of the present invention.
Figure 7:
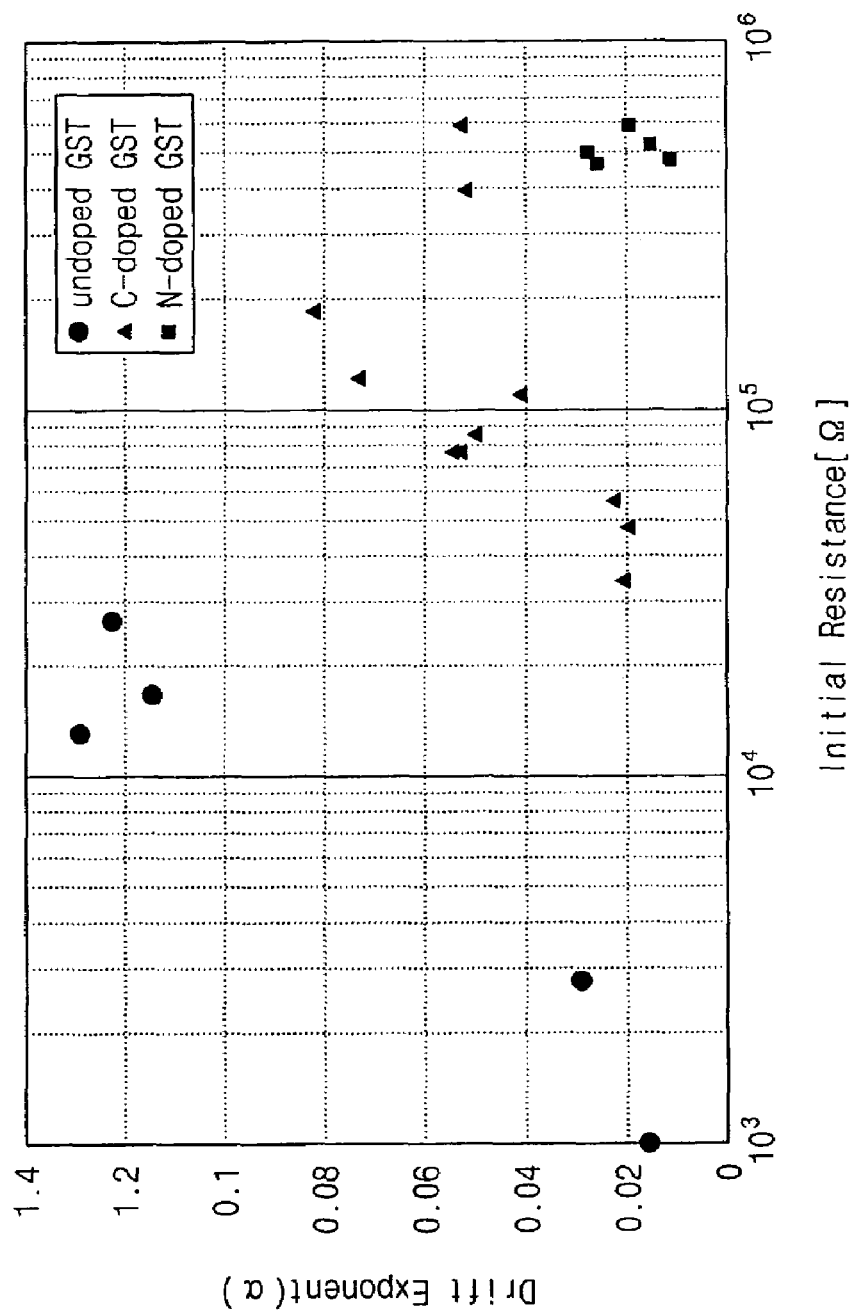
FIG. 7 is a plot of experimental data illustrating the reduced drift parameters (α) of a resistance-changeable material doped with carbon or nitrogen, in accordance with embodiments of the present invention.

Referring to FIGS. 6 and 7, an example whereby the applied impurity includes carbon or nitrogen will now be described. A distribution of the drift parameter (α) with respect to an initial resistance ($R_{ini}$) is represented in the resistance-changeable material as doped by carbon or nitrogen. The carbon-doped resistance-changeable material demonstrates greatly reduced drift parameter, in contrast with that exhibited by the undoped material. The nitrogen-doped material demonstrates an even further reduced drift parameter over the carbon-doped material. In general, the resistance-changeable material exhibits several kΩ to several tens kΩ of resistance in a crystalline state (i.e., SET state) and exhibits several MΩ of resistance when in an amorphous state (i.e., RESET state).

The experimental data of FIG. 7 demonstrates that the carbon-doped resistance-changeable material has a drift parameter (α) of less than about 0.08 when in the intermediate data states. The nitrogen doped resistance-changeable material has a drift parameter (α) of less than about 0.03 when programmed in the intermediate data states. Referring to Table 1 and FIG. 7, the carbon doped resistance-changeable material can be applied in cases where the desired tolerance is less than 20% and the nitrogen doped resistance-changeable material can be applied in cases where the desired tolerance is less than 10%.

In one embodiment, the GST material can first be formed, followed by application of nitrogen or carbon impurities. In a case where nitrogen impurities are applied to the GST material, nitrogen ion implantation and annealing can be performed. In this case, $N_2$, $N_2O$, and $NH_3$ gas can be used for the annealing process.

II. Hydrogen Treatment

It has been further determined that control over the value of the resistance drift exponent α of the programmable volume of the resistance-changeable material can be accomplished in a second embodiment of the present invention by performing a hydrogen treatment process on the chemical lattice of the material. In this manner, hydrogen atoms are present and available in the programmable volume of material. With the presence of hydrogen in the material, certain unstable defects that are naturally generated in the programmable volume at the time of programming can be stabilized, limiting the amount of resistance drift that occurs.

For example, the unstable $C_3^0$ structures, that are described above as being unstable structures that lead to resistance drift of the phase-change material, are stabilized with the presence of a stabilizing element, such as hydrogen atoms, causing stabilized $C_4^0$ structures to be formed. In this manner, since the equilibrium density of the unstable $C_3^0$ structures is effectively reduced, by their conversion to the stable $C_4^0$ structures, little to no conversion of unstable structures to the relatively stable $C_3^+$ and $C_1$ structures will occur in the programmable volume material and therefore, resistance drift in the material is much less likely to occur, or no resistance drift will occur.

In one approach to hydrogen-treatment of the resistance-changeable material, hydrogen atoms can be made to be present during formation of the resistance-changeable material. In one example, an insulation layer including a bottom electrode may be formed on a substrate. A resistance-changeable material layer, for example a chalcogenide alloy layer, can be formed on the insulation layer. In forming the resistance-changeable material layer, a thermal chemical vapor deposition or atomic layer deposition (ALD) process can be used. In one example embodiment, a source material for the chalcogenide alloy can include a first precursor having germanium, a second precursor having antimony, and a third precursor having tellurium. For example, the first precursor can include Ge($CH_2CHCH_2$)$_4$ or $GeH_4$, the second precursor can include Sb(CH($CH_3$)$_2$)$_3$, the third precursor can include Te(CH($CH_3$)$_3$)$_2$. A ligand decomposition gas can include $H_2$ or $NH_3$. Moreover, since the source material preferably includes hydrogen atoms, the ligand decomposition gas may include an excess of $H_2$ or $NH_3$. A carrier gas can comprise an argon gas. The resistance-changeable material layer can comprise, for example, $Ge_2Sb_2Te_5$:H.

In another approach to hydrogen-treatment of the resistance-changeable material, the resistance-changeable material can first be formed and then further processed by annealing the material in a hydrogen ambient. In this example, an insulation layer including a bottom electrode is formed on a semiconductor substrate, and a resistance-changeable material layer is formed thereon. The resistance-changeable material layer can be heat-treated in hydrogen ambient, wherein said treatment can be conducted at a temperature of 200~500° C.

In another approach to hydrogen-treatment of the resistance-changeable material, the resistance-changeable material can first be formed and then further processed by implanting hydrogen atoms into the material. In one example, this can be performed by forming a material layer such as silicon oxide or silicon nitride containing hydrogen ions on the resistance-changeable material. The material is then heat-treated, for example at a temperature of 200~500° C. to cause the hydrogen to diffuse into the resistance-changeable material.

Figure 8A:
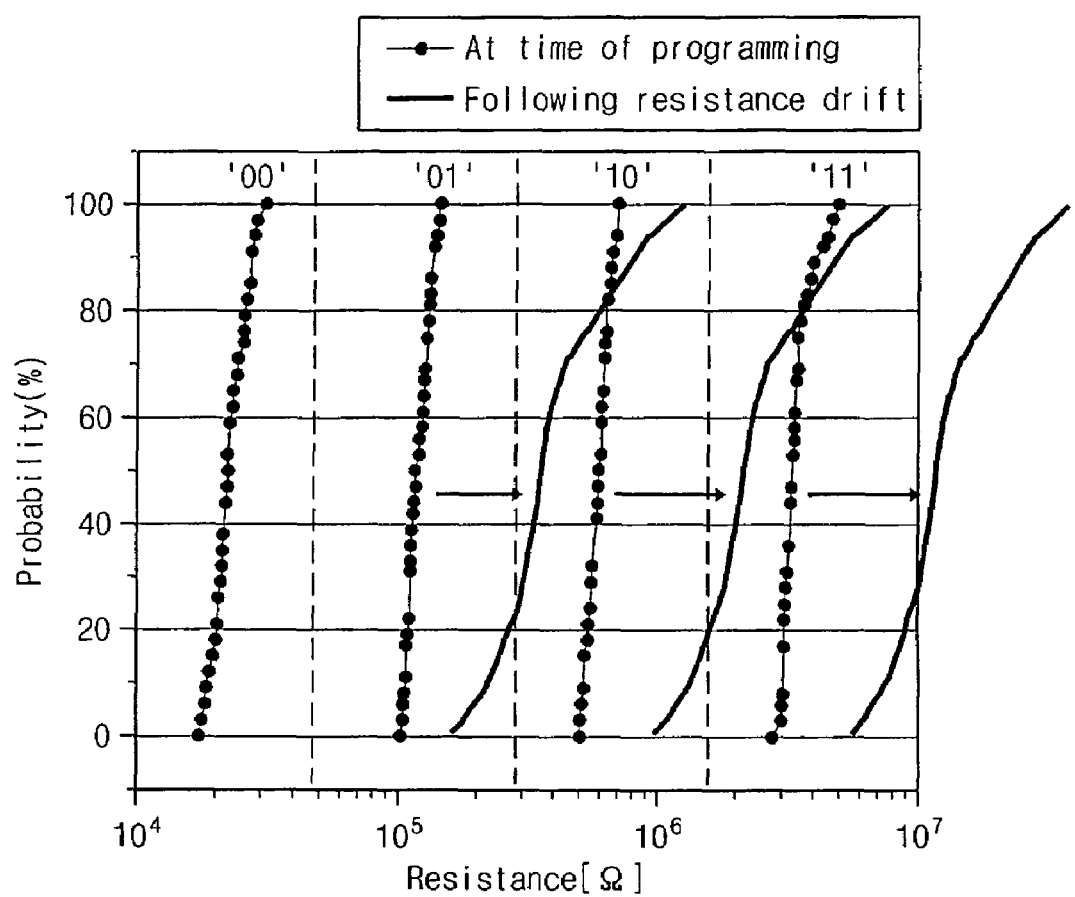
FIGS. 8A and 8B, are charts that demonstrate a change in resistance distribution in a multi-level phase change memory device, in a case where the resistance drift is not controlled (FIG. 8A), and in a case where the resistance drift of the material is controlled (FIG. 8B), respectively, in accordance with embodiments of the present invention.
Figure 8B:
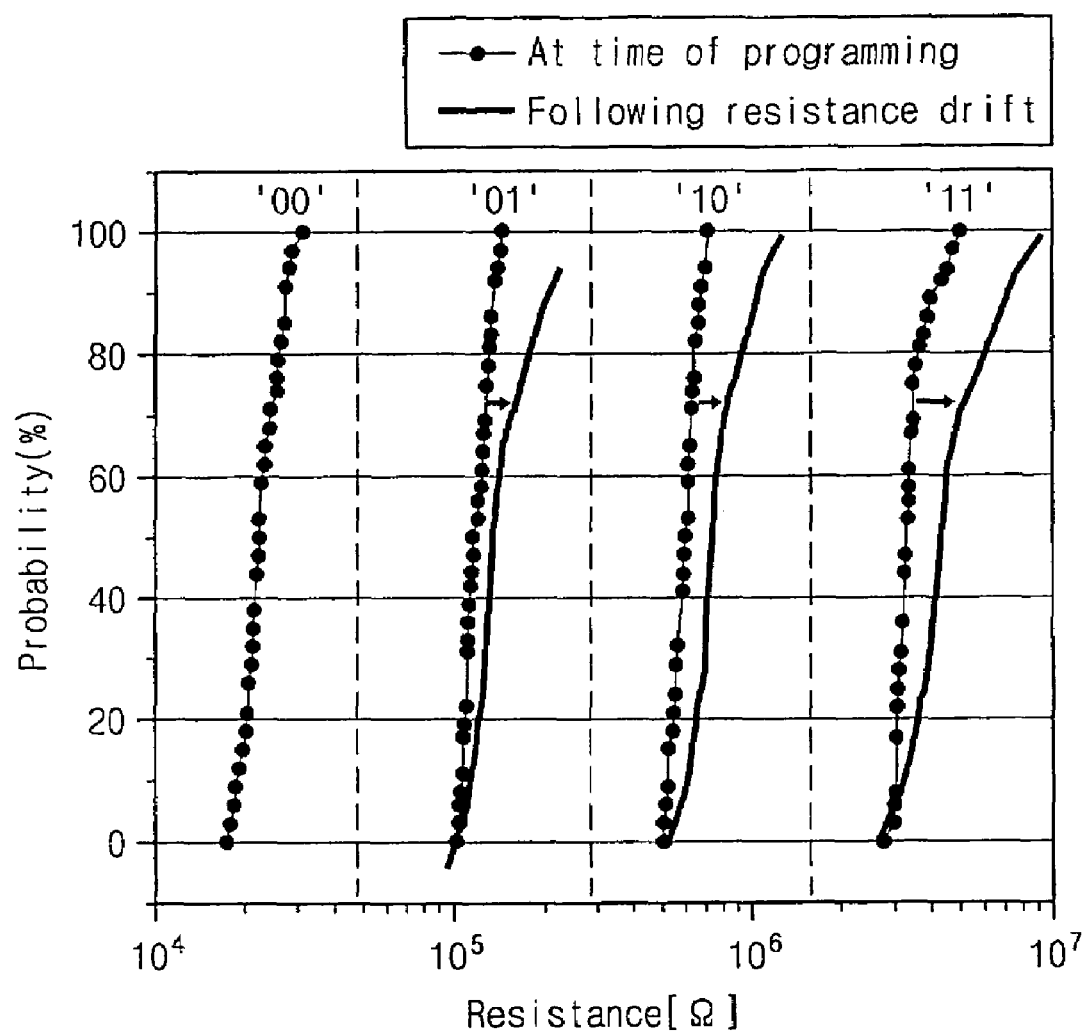

By modifying the resistance-changeable material to limit its resistance drift parameter ($\alpha$), for example, according to the techniques described above, resistance drift of the intermediate states can be controlled to within a predetermined allowed tolerance, so that the resulting drift parameter of the material is less than the critical drift parameter ($\alpha_c$). Referring to FIGS. 8A and 8B, these charts demonstrate a change in resistance distribution in a multi-level phase change memory device, in a case where the resistance drift is not controlled (FIG. 8A), and in a case where the resistance drift of the material is controlled (FIG. 8B), respectively. Vertical dashed lines define boundary lines that discriminate adjacent data states. Referring to FIG. 8A, it is difficult to discriminate neighboring data states 01, 10, 11 following resistance drift, since the resistance drift parameter of the resistance-changeable material is not controlled according to the techniques described herein. On the other hand, referring to FIG. 8B, discrimination between neighboring data states 01, 10, 11 is achieved since the resistance drift of the resistance-changeable material is properly controlled.

Figure 9:
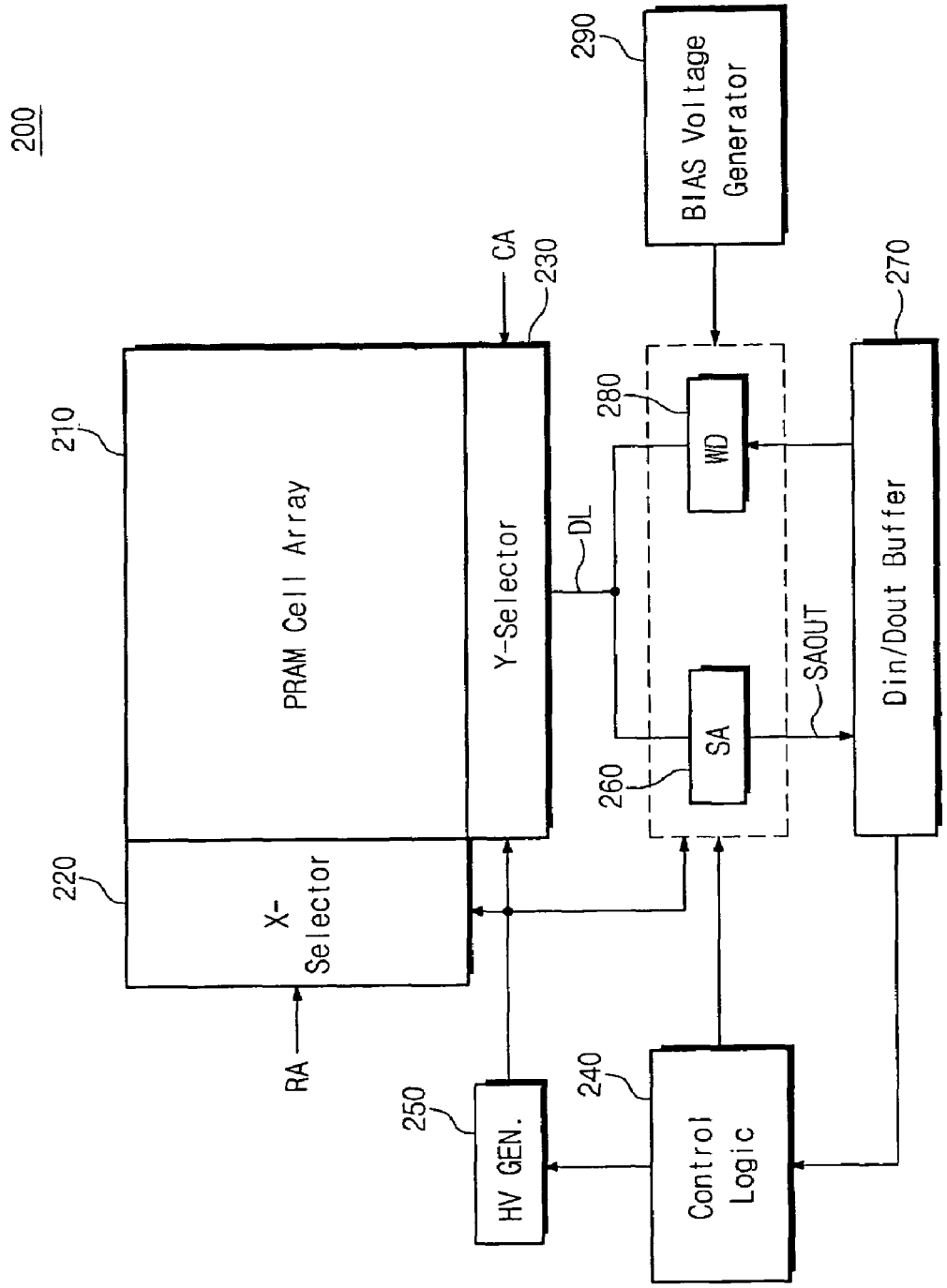
FIG. 9 is a block diagram of a memory device including a PRAM cell array containing a plurality of multiple-level phase-change programmable memory cells in accordance with an embodiment of the present invention.

FIG. 9 is a block diagram of a memory device 200 including a PRAM cell array 210 containing a plurality of multiple-level phase-change programmable memory cells in accordance with an embodiment of the present invention. The PRAM cell array includes an X-selector circuit 220 and Y-selector circuit 230 in accordance with standard memory device configurations. The X-selector circuit 220, also referred to as a row decoder, receives a row address RA signal, and the Y-selector circuit, also referred to as a column decoder, receives a column address CA signal.

Referring to FIG. 9, a phase change memory device 200 according to the present embodiment includes a memory cell array 210 that stores N-bit data (where N is 2 or more). A plurality of memory cells are arranged within the memory cell array 210 in rows (for example, along word lines) and columns (for example, along bit lines). Each memory cell may consist of a switching element and a resistance element. A switching element may be formed of various elements such as MOS transistors, diodes, and the like. A resistance element may be configured to include a phase-change film that includes the above-described resistance-changeable materials having the advantageous resistance-drift parameter $\alpha$ properties described above. Each memory cell may be a writable memory cell. Exemplary resistance elements are disclosed in U.S. Pat. Nos. 6,928,022, 6,967,865 and 6,982,913, the content of each being incorporated herein by reference in its entirety.

Continuing to refer to FIG. 9, a row selector circuit 220 is configured to select one of the rows (or word lines) in response to a row address RA signal, and a column selector circuit 230 is configured to select certain columns (or bit lines) in response to a column address CA signal. Control logic 240 is configured to control the overall operation of the multi-level phase change memory device 200 in response to an external read/write command. A high voltage generator circuit 250 is controlled by the control logic 240 and is configured to generate a high voltage that is used for the row and column selector circuits 220 and 230, a sense amplifier circuit 260, and a write driver circuit 280. For example, the high voltage generator circuit 250 may be implemented using a charge pump. It would be apparent to one skilled in the art that implementation of the high voltage generator circuit 250 is not limited to the embodiments described herein.

The sense amplifier circuit 260 is controlled by the control logic 240, and is configured to sense cell data via columns (or bit lines) selected by the column selector circuit 230. The sensed data SAOUT may be externally output via a data input/output buffer circuit 270. The sense amplifier circuit 260 is connected to a data bus DL, and is configured to supply sensing current I_SENSE to the data bus DL at a read operation. The write driver circuit 280 is controlled by the control logic 240, and is configured to supply write current to the data line DL according to data provided via the input/output buffer circuit 270. A bias voltage generator circuit 290 is controlled by the control logic 240, and is configured to generate bias voltages to be supplied to the sense amplifier circuit 260 and the write driver circuit 280.

Figure 10:
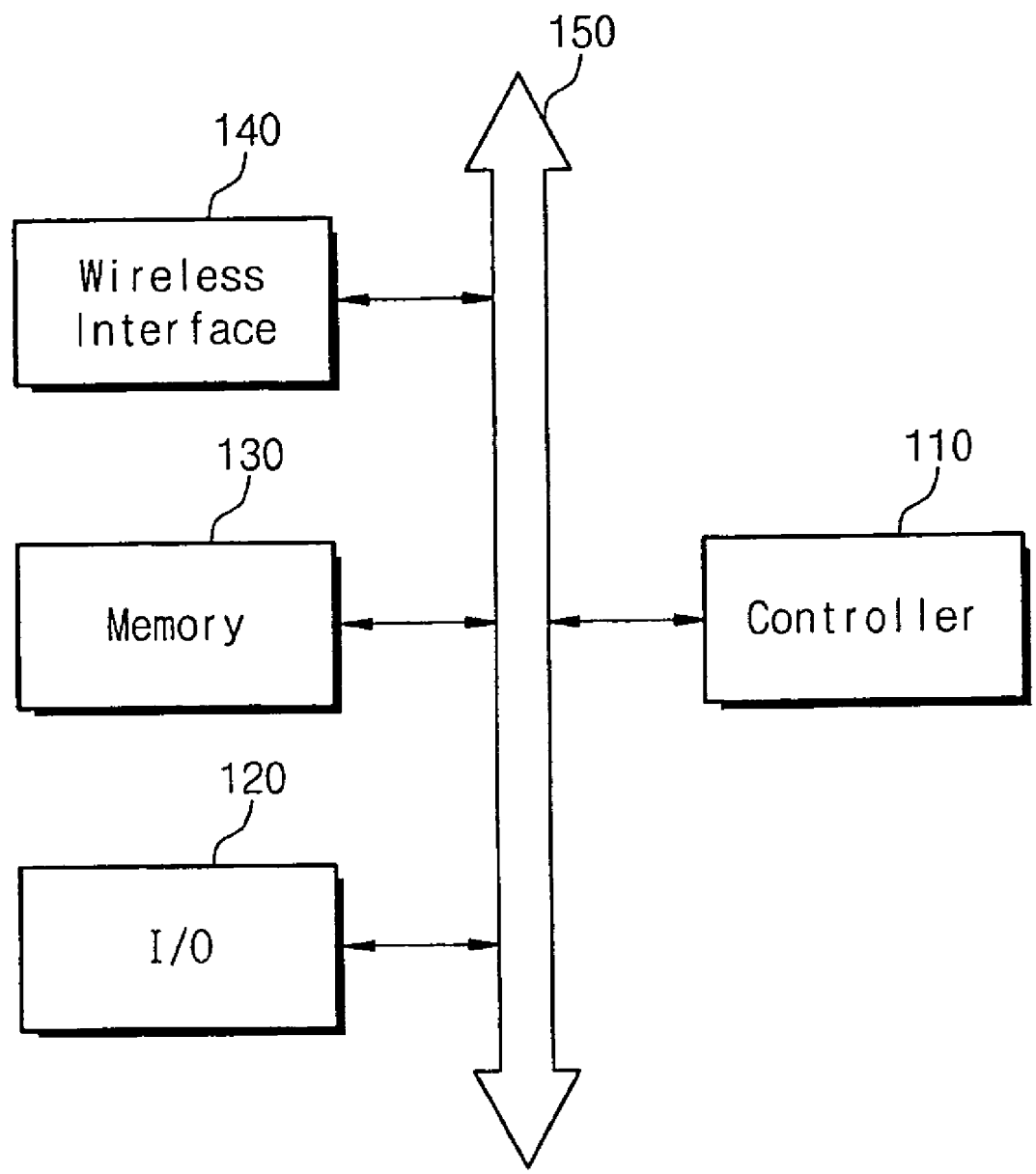
FIG. 10 is a block diagram of an electronic device including a semiconductor device PRAM cell array containing a plurality of multiple-level phase-change programmable memory cells in accordance with an embodiment of the present invention.

FIG. 10 is a block diagram of an electronic device 100 including a semiconductor device PRAM cell array containing a plurality of multiple-level phase-change programmable memory cells in accordance with an embodiment of the present invention. In various examples, the electronic device 100 can be used as a wireless communication device, i.e., PDA, laptop computer, mobile computer, web tablet, mobile phone, digital music player, or any device configured to transmit and/or receive information in a wireless environment. The electronic device 100 may include an input/output device 120, a memory 130, a wireless interface 140 and a controller 110 that communicate via a bus 150. The controller 110 comprises, for example, at least one of a microprocessor, digital signal processor, or microcontroller. The input/output device 120 may include, for example, a keypad, keyboard and display unit. The memory 130 may be used to store commands executed by the controller 110, or may be used to store user data. The memory 130 may further comprise various kinds of memories. The electronic device 100 may use a wireless interface 140 to receive data from a wireless communication network or to transmit data to the network, for example, through RF signals. The wireless interface 140 can include, for example, an antenna, wireless transceivers, and other necessary equipment for communicating wirelessly. Electronic devices 100 according to the present invention may be used as a communication interface protocol such as third generation communication systems, i.e, CDMA, GSM, NADC, E-TDMA, WCDMA, CDMA2000.

While the invention has been particularly shown and described with references to preferred embodiments thereof, it will be understood by those skilled in the art that various changes in form and details may be made herein without departing from the spirit and scope of the invention as defined by the appended claims.

For example, while the above-described embodiments depict multiple level cells that are operable in two or four states per cell, other numbers of states are conceivable, and equally applicable to the principles of the present disclosure. For example, a cell can have multiple-level states of a number that is a multiple of two, such as 4, 8, 16, 32, etc. states Also a cell can have other numbers of states that are not multiples of two, such as 3, 5, 6, 7, etc. states.

What is claimed is:

1. A method of controlling resistance drift in a memory cell of a resistance changeable material memory device, comprising treating the resistance changeable material in the memory cell so that a drift parameter for the memory cell is less than about 0.18, wherein a change in resistance of a memory cell over the time period is determined according to the relationship:

$$R_{drift} = R_{initial} \times t^\alpha;$$

where $R_{drift}$ represents a final resistance of the memory cell following the time period, $R_{initial}$ represents the initial resistance of the memory cell following the programming operation, t represents the time period; and α represents the drift parameter.

2. The method of claim 1, wherein the memory cell is programmed by the programming operation to occupy one of a plurality of states, each state of the plurality of states corresponding to a range of resistances that are independent of neighboring resistance ranges of neighboring states, wherein the initial resistance of a memory cell occupies an initial state corresponding to an initial range of resistances following the programming operation and wherein the initial range of resistances of each state is selected so that a resistance of the memory cell remains in the initial range of resistances following the time period.

3. The method of claim 2, wherein the memory cell is programmed by the programming operation to occupy more than two states.

4. The method of claim 3, wherein a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state, wherein the memory cell is programmed to occupy the at least one intermediate state of the plurality of states.

5. The method of claim 1, wherein the drift parameter for the memory cell is less than about 0.058.

6. The method of claim 1, wherein the resistance changeable material comprises a chalcogenide-based material.

7. The method of claim 6, wherein treating a resistance changeable material in the memory cell comprises controlling the drift parameter of the memory cell by doping the resistance changeable material in the memory cell with a doping material that includes nitrogen or carbon.

8. The method of claim 6, wherein treating a resistance changeable material in the memory cell comprises controlling the drift parameter of the memory cell by processing the resistance changeable material in the memory cell to include hydrogen atoms in the material.

9. The method of claim 8, wherein processing the resistance changeable material comprises providing a source material including hydrogen atoms during formation of the resistance changeable material.

10. The method of claim 8, wherein processing the resistance changeable material comprises annealing in a hydrogen ambient after formation of the resistance changeable material.

11. The method of claim 8, wherein processing the resistance changeable material comprises implanting hydrogen ions in the resistance changeable material.

12. The method of claim 8, wherein processing the resistance changeable material comprises:
forming a layer containing hydrogen on the resistance changeable material; and
heat treating the layer so that the hydrogen diffuses into the resistance changeable material.

13. A memory device comprising a plurality of memory cells, each memory cell comprising a resistance changeable material that has an initial resistance that is determined in response to an applied programming current in a programming operation, the resistance of the memory cell varying from the initial resistance over a time period following the programming operation, according to the relationship:

$$R_{drift} = R_{initial} \times t^\alpha,$$

where $R_{drift}$ represents a final resistance of the memory cell following the time period, $R_{initial}$ represents the initial resistance of the memory cell following the programming operation, t represents the time period; and α represents a drift parameter of the memory cell, and wherein the drift parameter is less than about 0.18.

14. The memory device of claim 13, wherein each memory cell is programmed by the programming operation to occupy one of a plurality of states, each state of the plurality of states corresponding to a range of resistances that are independent of neighboring resistance ranges of neighboring states, wherein the initial resistance of a memory cell occupies an initial state corresponding to an initial range of resistances following the programming operation and wherein the initial range of resistances of each state is selected so that a resistance of the memory cell remains in the initial range of resistances following the time period.

15. The memory device of claim 14, wherein the memory cell is programmed by the programming operation to occupy more than two states.

16. The memory device of claim 15, wherein a low state of the plurality of states corresponds to a state having a lowest range of resistances, a high state of the plurality of states corresponds to a state having a highest range of resistances, and at least one intermediate state of the plurality of states corresponds to at least one state having a range of resistances greater than the lowest range of resistances of the low state and less than the highest range of resistances of the high state.

17. The memory device of claim 16, wherein the memory cell is programmed to occupy the at least one intermediate state of the plurality of states.

18. The memory device of claim 13, wherein the drift parameter for the memory cell is less than about 0.058.

19. The memory device of claim 13, wherein the resistance changeable material is a chalcogenide-based material.

20. The memory device of claim 19, wherein the drift parameter of the memory cell is determined by doping the resistance changeable material in the memory cell with a doping material that includes nitrogen or carbon.

21. The memory device of claim 19, wherein the drift parameter of the memory cell is determined by processing the resistance changeable material in the memory cell to include hydrogen atoms in the material.

22. The memory device of claim 19, wherein the initial resistance corresponds to a ratio of an amount of the cell material that is in a crystalline state relative to an amount of the cell material that is in an amorphous state, as a result of the programming operation.

23. The memory device of claim 19, wherein each memory cell further comprises a heating electrode in thermal communication with the corresponding cell material of the memory cell, the heating electrode receiving the programming current to heat the corresponding memory cell so that the cell material has the initial resistance.

24. The memory device of claim 19, wherein the chalcogenide material comprises a material selected from the group of materials consisting of Ge, Sb, Sn, As, Si, Pb, Te, Se, S, a combination thereof, and an alloy thereof.

25. The memory device of claim 24, wherein the chalcogenide material further includes at least one impurity selected from the group consisting of Bi, Sr, Si, and O.

26. An electronic device including a memory system, the memory system comprising:
- a memory controller that is arranged to connect to a data bus at which data signals are transferred; and
- a memory device connected to the memory controller that stores and retrieves the data signals, the memory device comprising:
  - a plurality of memory cells, each memory cell comprising a resistance changeable material that has an initial resistance that is determined in response to an applied programming current in a programming operation, the resistance of the memory cell varying from the initial resistance over a time period following the programming operation, according to the relationship:

$$R_{drift} = R_{initial} \times t^{\alpha},$$

where $R_{drift}$ represents a final resistance of the memory cell following the time period, $R_{initial}$ represents the initial resistance of the memory cell following the programming operation, t represents the time period; and $\alpha$ represents a drift parameter of the memory cell, and wherein the drift parameter is less than about 0.18.

* * * * *